United States Patent [19]

Kaya et al.

[11] Patent Number: 5,216,270
[45] Date of Patent: Jun. 1, 1993

[54] NON-VOLATILE MEMORY CELL WITH TUNNEL WINDOW STRUCTURE AND METHOD

[75] Inventors: Cetin Kaya, Dallas; Howard L. Tigelaar, Allen; Mauzur Gill, Rosharan, all of Tex.

[73] Assignee: Texas Instruments Incorporated, Dallas, Tex.

[21] Appl. No.: 662,673

[22] Filed: Feb. 28, 1991

[51] Int. Cl.$^5$ .................. H01L 29/68; H01L 21/265
[52] U.S. Cl. ................................ 257/321; 257/316; 257/390; 437/43; 437/48; 437/49; 437/913; 437/979
[58] Field of Search .............. 357/23.5, 59, 41, 45, 357/49; 437/48, 49, 43, 913, 979

[56] References Cited

U.S. PATENT DOCUMENTS

| | | | |
|---|---|---|---|
| 4,912,676 | 3/1990 | Paterson et al. | 365/185 |
| 4,924,437 | 5/1990 | Paterson et al. | 357/23.5 |
| 4,994,403 | 2/1991 | Gill | 357/23.5 |

Primary Examiner—Edward Wojciechowicz
Attorney, Agent, or Firm—Ira S. Matsil; James C. Kesterson; Richard L. Donaldson

[57] ABSTRACT

A non-volatile memory cell 10 can be fabricated by doping a semiconductor substrate 8 to form source 12 and drain 14 such that at least one small undoped region remains in source 12. A first insulation layer 26a is formed over the source 12 such that the thickness of the layer is less over the undoped region than the doped region while insulation regions 26b and 20 are simultaneously formed over the drain 14 and channel 16 regions. The insulation layer 26a formed above the undoped region of the source 12 is etched to form a tunnel window 28 and then a thin insulation layer is formed over the tunnel window 28. A conductive floating gate 16 is formed over a portion of the first insulation layer 26a which includes the tunnel window 28, over the channel region 16 and over a portion of the second insulation region 26b. Next, an insulation region 24 is formed over the floating gate 16 and a control gate 18 is formed over the insulation region 24. Other structures and methods are also disclosed.

16 Claims, 6 Drawing Sheets

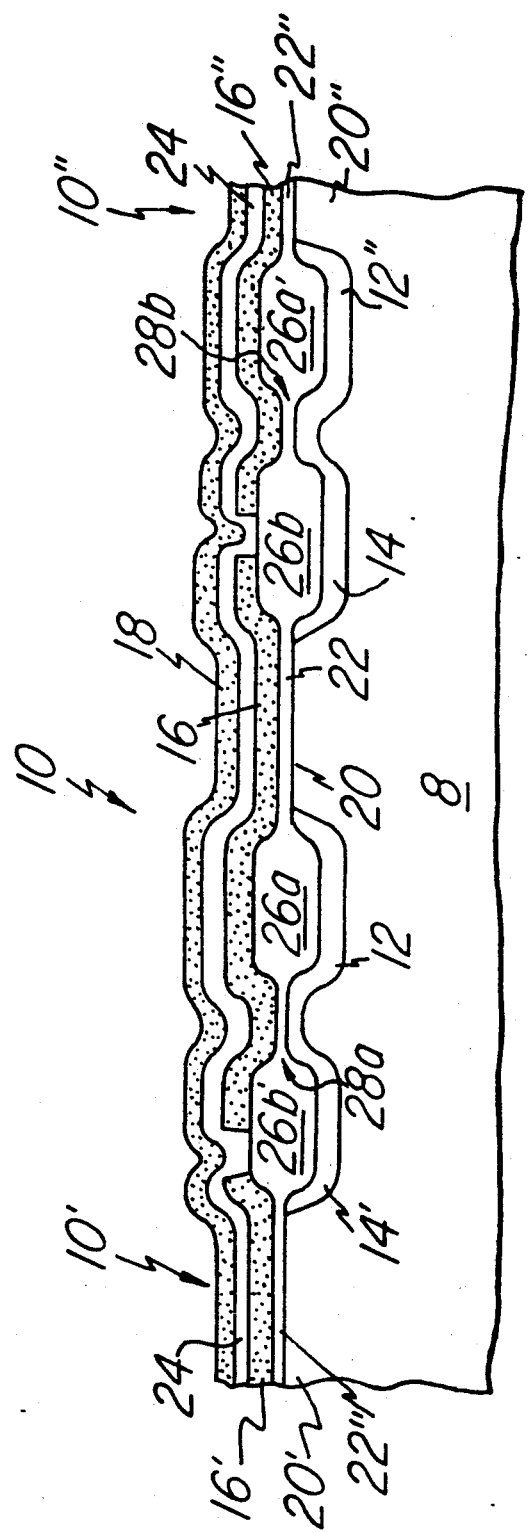
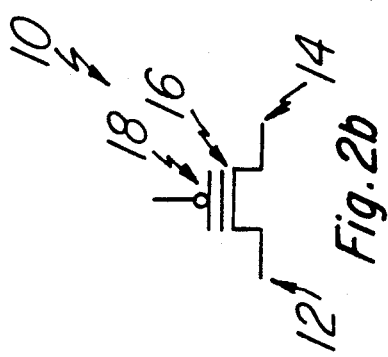
Fig. 2a
Fig. 2b

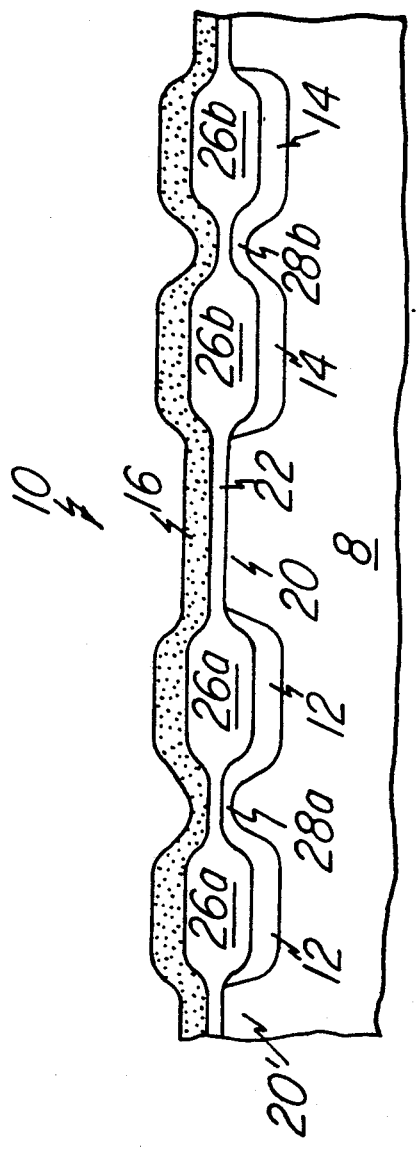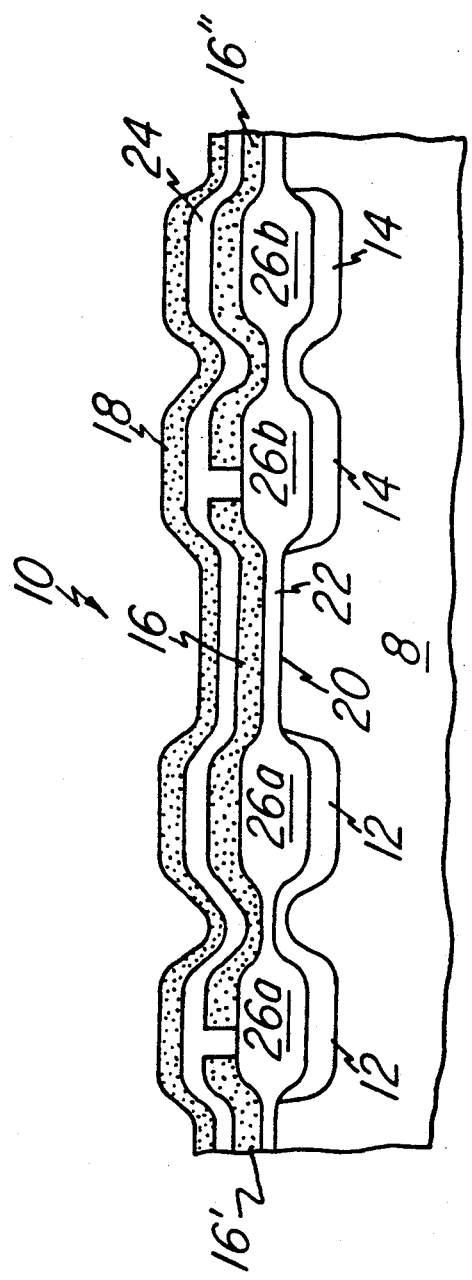

NON-VOLATILE MEMORY CELL WITH TUNNEL WINDOW STRUCTURE AND METHOD

NOTICE (C) Copyright *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention relates generally to semiconductor devices and specifically to a non-volatile memory cell structure and method of fabrication.

BACKGROUND OF THE INVENTION

A read-only memory (ROM) is a type of memory in which data can be permanently stored, for example, by blowing metallic links during programming thereof. Such type of memory can be conventionally accessed at specific locations to read the programmed contents thereof. A much more versatile type of ROM is the electrically programmable read-only memory (EPROM) which can be electrically programmed to store data. Some versions of these devices store data permanently; others, however, can be erased with ultraviolet light or an electrical current.

Buried bit line EPROM or EEPROM arrays are known which utilize buried, doped lines, usually n+ conductivity doped crystalline silicon under thick oxide regions as bit lines for the array. The doped lines then act as the source/drain regions of the transistors of the memory cells. A typical EPROM of the advanced contactless array type is disclosed, for example in U.S. Pat. No. 4,698,900, issued Oct. 13, 1987.

EPROM cells in which tunnel windows are cut through the thick oxide layers that are formed over the buried bit lines have also been built. In these windows, the oxide thickness above the buried n+ regions is thin enough to allow the well known tunneling phenomena to occur for writing and/or erasing to the storage transistors.

However, several problems exist with the current state of the art. Current flash EEPROMs using buried bit lines employ the tunnel window at the field oxide and buried oxide interface. It is becoming more and more difficult to scale the filed oxide due to moat encroachment. This problem increases the cell size and therefore limits the number of cells which can be built on a chip.

Another problem exists with the yield and reliability of devices built using prior art fabrication methods. Due to the relatively large size of the tunnel windows built using prior art methods, yield is low and reliability is poor at the thin oxide. A method which greatly reduces the surface area of tunnel window is desirable. In addition, prior art methods usually employ wet etch techniques to open the patterned tunnel windows prior to growing the tunnel oxide. Because of the isotropic nature of wet etches, the tunnel windows are enlarged. Anisotropic dry etch methods could also be used to open the tunnel window but are not used because dry etch introduces risk of damaging and contaminating the silicon surface.

Accordingly, improvements which overcome any or all of the problems are presently desirable.

SUMMARY OF THE INVENTION

Other objects and advantages will be obvious, and will in part appear hereinafter and will be accomplished by the present invention which provides a device and a method for fabricating an array of non-volatile memory cells.

A method for fabricating a non-volatile memory cell comprises doping a semiconductor substrate to form highly doped source and drain regions such that at leas tone small undoped region remains in the source region. Next, an insulation layer, such as an oxide, is formed over the source region such that the thickness of this insulation layer over the undoped region is substantially less than the thickness of this insulation layer over the more heavily doped remainder of the source. Simultaneously, insulation layers over the drain region and channel are formed. Next, the insulation layer formed above the undoped region of the source is preferentially etched to form a tunnel window and an insulation layer, 100 Å oxide for example, over the tunnel window is formed. Next, a conductive floating gate is formed over a portion of the first insulation layer which includes the tunnel window, and over the channel region, and over the drain layer. An insulation region and control gate are then formed over the floating gate.

an advantage of the invention is it provides a small cell size because a field oxide is not needed. A 4.16 micron$^2$ cell can be built using this method using 0.6 micron features. Also, this structure provides a wider buried insulation layer than prior art cells and has lower sheet resistance associated with the bitlines. In addition, the tunnel is a window and therefore no filament problems exist between adjacent wordlines. Also, the tunnel is fully enclosed by the thick buried insulation region and as a result there is less bitline leakage. Another advantage is that the cell size is determined by the buried insulation region mask, the floating gate mask and the stack mask. This provides a scalable cell structure.

BRIEF DESCRIPTION OF THE DRAWINGS

The above features of the present invention will be more clearly understood from consideration of the following descriptions in connection with accompanying drawings in which:

FIG. 2a is a greatly enlarged cross sectional view of a memory cell structure of the present invention;

FIG. 2b is schematic diagram of FIG. 2a;

FIG. 3b and 3c are cross sectional views of the cell shown in FIG. 3a;

FIG. 4–6 are cross sectional views illustrating the remaining process steps of the present invention.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific way to make and use the invention, and do not delimit the scope of the invention.

Figure 1:
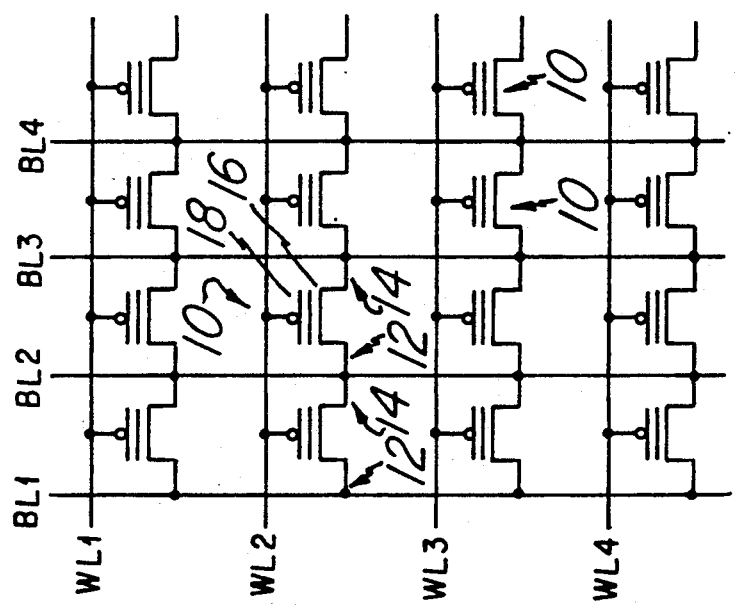
FIG. 1 is a schematic diagram of an array of cells according to one embodiment of the present invention.

Referring first to FIG. 1, an array of memory cells is shown according to one embodiment. Each cell is a floating gate transistor 10 having a source 12, a drain 14, a floating gate 16, and a control gate 18. All of the gates 18 in a row of cells are connected to a word line or row address line denoted here as WL1 through WL4. All wood lines are typically connected to a row decoder (not shown). All of the source and drain electrodes 12 or 14 in a column of cells are connected to a bit line or a column line denoted here as BL1 through BL4. All bit lines are typically connected to a column decoder (not shown).

In the array illustrated in FIG. 1, the source 12 of one cell also serves as the drain 14 of an adjacent cell. Obviously, the cells on the border are laterally adjacent to only one cell and therefore do not share both source 12 and drain 14. Of course the functions of the source 12 and drain 14 may be reversed.

The structure of one of the cells is seen in a greatly enlarged sectional view in FIG. 2a and in schematic form in FIG. 2b. FIG. 2a illustrates a transistor cell 10 and portions of two adjacent cells 10' and 10". As shown with reference to FIG. 1, the present invention may be formed as an array of identical cells.

The cell 10 is formed in a semiconductor substrate 8 which may be P-type silicon for an N-channel silicon gate MOS transistor, for example. The transistor 10 of the cell is created by a channel region 20 between N+ type regions 12 and 14 which are the source and drain. Separating adjacent cells are buried insulation regions 26a and 26b which are formed substantially over source and drain regions 12 and 14. The buried insulation region 26 may be comprised of thermally grown silicon dioxide and typically is 200 Å thick and is also referred to as the buried oxide 26. The floating gate 16, which may be composed of phosphorus-doped polycrystalline silicon, lies above channel region 20 and portions of buried insulation regions 26. The floating gate 16 is insulated from the underlying channel region 20 by a gate insulation layer 22 which according to one embodiment is a 250 Å layer of silicon dioxide. The control gate 18, which may also be composed of phosphorus-doped polycrystalline silicone, extends beyond the edges of the floating gate 16 as serves as a wordline. As illustrated in FIG. 2a, control gate 18 also extends over the floating gates 16' and 16" of adjacent cells. The control gate 18 is isolated from the floating gate by an insulation layer 24 which may be of selected thickness, as is well known in the art. Each buried insulation region 26 includes a tunnel window 28 which separates the floating gate 16 and source 12. The tunnel window 28 is typically 100 Å thick.

The cell 10 is designed so that it may be erased by using the well-known phenomena of Fowler Nordheim tunneling at the tunnel window 28 by applying suitable voltage at the control gate, source and drain. For the purpose of example only, suitable voltages include −11 volts at the control gate, +5 volts at the source, and the drain is either grounded (0 volts) or allowed to float. Typically, a number of cells are erased simultaneously. The cell 10 may be programmed by utilizing either tunneling at the tunnel window 28 or by channel hot electron injection at the channel 20/drain 14 interface. In an embodiment using the channel hot electron injection method, the program function may typically be accomplished by applying 12 volts at the control gate, 0 colts at the source, and 5 bolts at the drain. In an embodiment using the Fowler/Nordheim tunneling method, the program function may typically be accomplished by applying 17 volts at the control gate, applying 0 volts at the source, and allowing the drain to float. The cell 10 is read in the same manner of currently fabricated memory cells.

The cell 10 of the present invention may be fabricated according to the steps illustrated in FIGS. 3–6 as discussed below. Of course, numerous variations, as is well known in the current art, are possible.

Figure 3A:
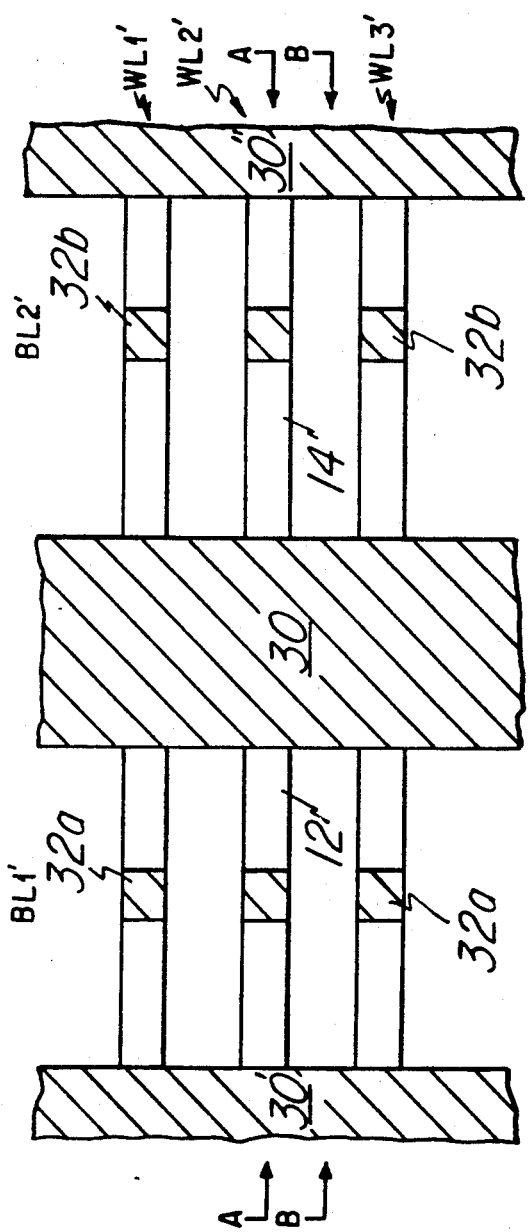
FIG. 3a is a top view illustrative of the first step of fabricating the memory cell according to the present invention.
Figure 3B:
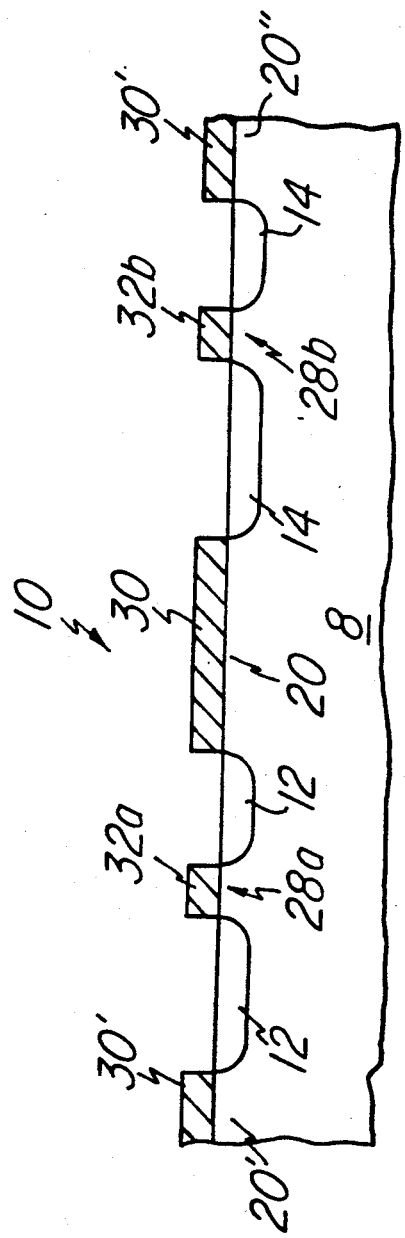
Figure 3C:
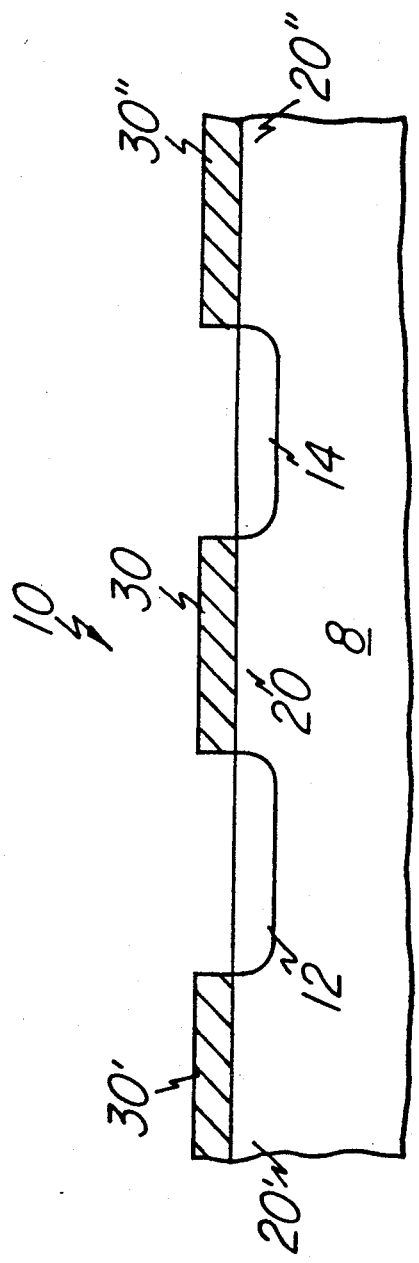
Figure 4:
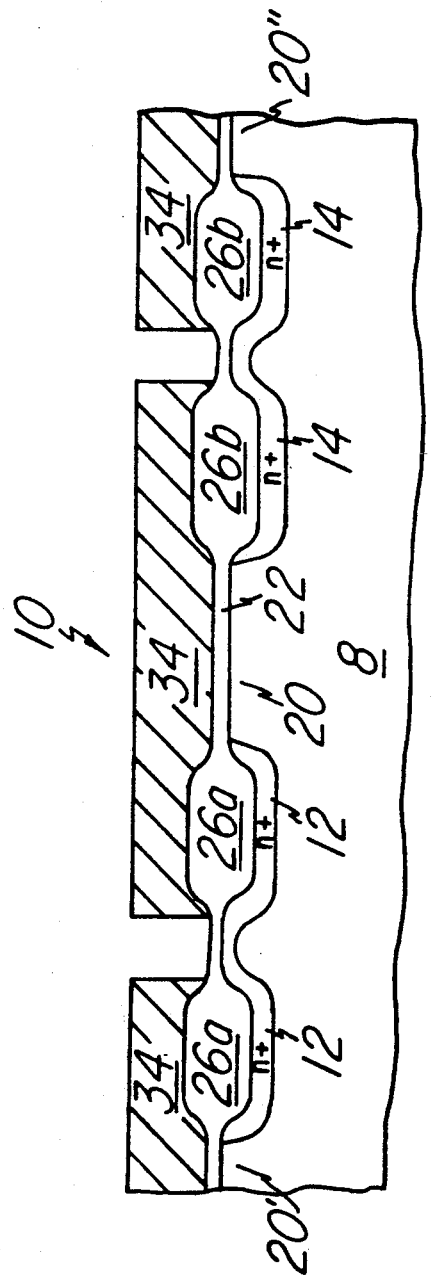

A top view of the cell 10 during the first steps of the fabrication process is shown in FIG. 3a. FIG. 3b illustrates a cross-sectional view along AA of FIG. 3a and FIG. 3c illustrates a cross-section view along BB of FIG. 3a. FIGS. 4 through 6 illustrate a cross sectional view of the remaining steps of the fabrication process along AA of FIG. 3a.

Referring now to FIG. 3a, the top view of two bitlines BL1' and BL2' and three wordlines WL1' through WL3' are shown. Bitline BL1' serves as the source 12 and bitline BL2' serves as the drain 14 of the cell to be fabricated. As the first step, resist layer 30 is patterned to form the channel region 20 and resist layers 32a and 32b are patterned to form the small undoped regions which will later comprise to form tunnel windows 28a and 28b. The resist patterns 32a and 32b may be square, or rectangular or other shapes as determined by design choice. The exposure surface is then doped to form source and drain regions 12 and 14. As an example only, one suitable method for doping the surface is to implant arsenic; however, other doping methods which are well known in the art may be used. The surface of the substrate 8 may be lightly doped prior to patterning resist layers 30 and 32 if a doped channel region 20 is desired.

Referring now to FIG. 4, resist layers 30 and 32 are removed and buried insulation regions 26a and 26b and gate insulation region 20 are formed. A typical process is to thermally grow an oxide. As is well known in the art, the thickness of the oxide is in part determined by the doping of the substrate below. Therefore, the doped regions will grow a much thicker oxide, typically 2000 Å, while the undoped (or lightly doped) regions will grow a thinner oxide, typically 200 Å. This method allows a thick oxide to be formed for the buried oxide region 26 and a thinner oxide for the gate oxide 20. Also a thin oxide layer exists over the small undoped region where the tunnel window 28 will be formed as discussed below.

The next step is to form resist layer 34 over the thin oxide which exists over the small undoped region of the source 12 and drain 14. This region is patterned to expose only the areas which will comprise the tunnel window 28. As discussed above, each cell may include more than one tunnel window, although this is not illustrated in the figures.

It is desirable for the source 12 and drain 14 regions to be homogeneously doped under the tunnel area. This homogeneous doping may be accomplished through impurity diffusion during later processing steps or during a specifically designed anneal process. The doping may also be accomplished through an implantation step which utilizes the windows formed by resist layer 34.

The next step in the process flow is to etch the small undoped region oxide over the desired location for tunnel window 28. The resist layer 34 is then stripped and an additional oxide layer is thermally grown to form the tunnel window 28. The tunnel window 28 is grown to a thickness of 100 Å, for example. During this step, the thickness of gate oxide 20 will increase to 250 Å and the thickness of the buried oxide 26 will not change substantially, ie., will remain 200 Å. Of course, the oxide thickness can be varied according to the design of the desired cell structure. Due to the encroachment of the thick oxide 26 over the heavily doped n+ region, the tunnel window may be vary small, as much as several tenths of a micron smaller than the resist pattern or more. This feature provides an advantage over prior art methods, which form larger tunnel windows, since the reliability and yield of the thin oxide layer degrades as the surface area of the layer increases.

Referring next to FIG. 5, a conductive layer 16 is formed over the surface (as illustrated in FIG. 3a). The conductive layer, sometimes referred to as poly1, may be formed by depositing a layer of polycrystalline silicon and then doping the layer with phosphorus.

The conductive layer 16 is then etched to form floating gates 16, 16' and 16'' as illustrated in FIG. 6. The floating gates overlap the two adjacent buried oxide regions 26a and 26b and the channel region 20. Each floating gate 16 also overlaps the tunnel regions(s) 28 of one of the adjacent buried oxide regions 26. The width of the floating gate 16 may exceed that of the tunnel with 28.

The next step in the process flow is to form insulating layer 24 over floating gates 16, 16' and 16''. In a preferred embodiment, insulation layer 24 is comprised of multiple layers. For example, layer 24 may be formed by depositing an oxide layer followed by depositing a nitride layer. Alternatively, the insulation layer 24 may be formed by a thermally grown oxide layer.

The conductive layer 18 is then formed over floating gate 16 such that it is electrically isolated by insulating layer 24. Conductive layer 18 is the control gate of the cell and also forms the wordline of the array as shown in FIG. 1. As with the floating gate 16, the control 18, sometimes referred to as poly2, may be formed by depositing a layer of polycrystalline silicon and then doping the layer with phosphorus.

Figure 7:
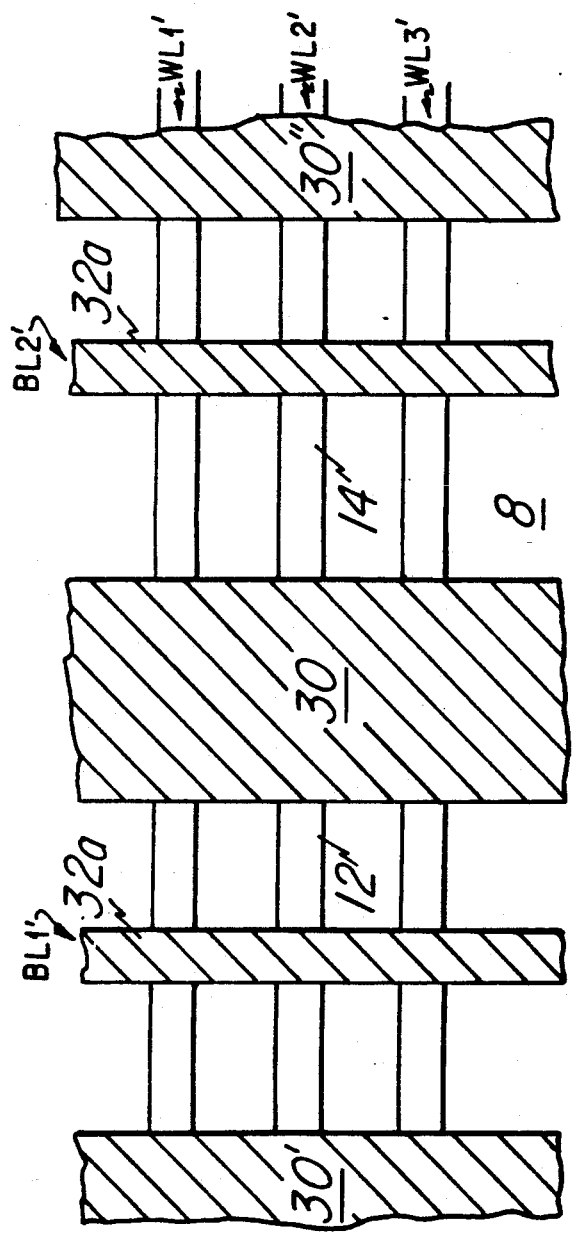
FIG. 7 is a top view illustrative of the first step of fabricating the memory cell of a second preferred embodiment of the present invention.

Several variations of this cell may also be fabricated by the method illustrated above. One such variations would utilize tunnel strips as illustrated in FIG. 7 which shows a top view of the cell during the first steps of processing. This figures is comparable to FIG. 3a and FIG. 3b as previously discussed. The remaining steps in the process are the same as discussed above with reference to FIGS. 4–7. In this embodiment, the tunnel spans the cell along the bitline. The cell is fabricated as discussed with reference to FIGS. 3 through 6 by adjusting the masks used to form resist layers 32 (as shown in FIG. 3) and resist layer 34 (as shown in FIG. 4). The cell of FIG. 7 has the advantage that the y-pitch, ie. word line pitch, does not depend on tunnel alignment. Also a small, scalable cell size is available.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating a non-volatile memory cell comprising:
    providing a semiconductor substrate of a first conductivity type;
    patterning said substrate to form a source and a drain region separated by a channel region, wherein said source includes at least one small region spaced a selected distance from said channel region;
    doping said source and drain regions to a second conductivity type wherein said channel region and said small region remain said first conductivity type;
    forming a first insulation layer over said source region such that the thickness of said first insulation layer over said small region of said source is substantially less than the thickness of said first insulation layer over the remainder of said source, and simultaneously forming a second insulation layer over said drain region and a third insulation layer over said channel;
    forming a tunnel window by etching said first insulation layer formed above said small region of said source;
    forming a insulation layer over said tunnel window;
    forming a conductive floating gate over a portion of said first insulation layer which includes said tunnel window, and over said channel region, and over a portion of said second insulation layer;
    forming a fourth insulation region over said floating gate; and
    forming a conductive control gate over said fourth insulation region.

2. The method of claim 1 wherein said method for fabricating a non-volatile memory cell comprises fabricating an array of non-volatile memory cells wherein the first insulation layer of one cell also serves as the second insulation layer of an adjacent cell.

3. The method of claim 1 wherein said step of doping comprises implanting arsenic.

4. The method of claim 1 wherein said step of forming a first insulation comprises the step of thermally growing an oxide.

5. The method of claim 1 wherein said step of forming a tunnel window comprises the step of forming a tunnel window which is smaller than said patterned small region of said source.

6. The method of claim 1 and further comprising the step of doping said small region in said source region prior to etching said first insulation layer formed above said small region.

7. The method of claim 6 wherein said step of doping said small region comprises the step of doping by implantation.

8. The method of claim 6 wherein said step of doping said small region comprises the step of doping by diffusion of dopant from surrounding heavily doped region.

9. The method of claim 1 wherein said step of forming a fourth insulation region comprises the step of depositing an oxide followed by the step of depositing a nitride.

10. The method of claim 1 wherein said step of forming a fourth insulation region comprises the step of thermally growing an oxide followed by the step of depositing a nitride.

11. The method of claim 1 wherein said step of forming a conductive floating gate and said step of forming a conductive control gate comprise the steps of depositing a polysilicon layer, followed by doping said polysilicon layer, followed by etching said polysilicon layer.

12. An array of at least two non-volatile memory cells formed on a semiconductor substrate comprising:

highly doped source and drain regions separated by a channel region for each cell, wherein the source of one cell also serves as the drain of an adjacent cell;

first and second buried insulation regions formed substantially over said source and drain regions;

first and second tunnel windows formed in said first and second buried insulation regions over said source and drain regions, said tunnel windows spaced a selected distance from said channel region;

an insulating layer formed over each of said channel regions;

a floating gate for each cell formed over a portion of said first buried insulation region including said tunnel window, over said channel region, and over a portion of said second buried insulation region not including said tunnel window; and a control gate formed substantially over but electrically insulated from said floating gates and over said first and second buried insulation regions.

13. The structure of claim 12 wherein said memory cells are arranged in rows and columns, wherein each row of said cells shares a control gate and wherein each column of said cells shares source and drain regions.

14. The structure of claim 12 wherein said first and second buried insulating regions and said insulating region formed over said channel comprise an oxide.

15. The structure of claim 12 wherein said first and second buried insulation regions are about 200 angstroms thick, said tunnel window is about 100 angstroms thick and said insulating region formed over said channel is about 250 angstroms thick.

16. The structure of claim 12 wherein said floating gate and said control gate comprise polysilicon.

* * * * *